US011922993B2

(12) United States Patent
Kawai et al.

(10) Patent No.: US 11,922,993 B2
(45) Date of Patent: *Mar. 5, 2024

(54) READ-TIME OVERHEAD AND POWER OPTIMIZATIONS WITH COMMAND QUEUES IN MEMORY DEVICE

(71) Applicant: Micron Technology, Inc., Boise, ID (US)

(72) Inventors: Koichi Kawai, Yokohama (JP); Sundararajan Sankaranarayanan, Fremont, CA (US); Eric Nien-Heng Lee, San Jose, CA (US); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/095,646

(22) Filed: Jan. 11, 2023

(65) Prior Publication Data
US 2023/0148018 A1    May 11, 2023

Related U.S. Application Data

(63) Continuation of application No. 17/318,579, filed on May 12, 2021, now Pat. No. 11,568,921.

(51) Int. Cl.
| G11C 7/12 | (2006.01) |
| G11C 11/4074 | (2006.01) |
| G11C 11/408 | (2006.01) |
| G11C 11/4093 | (2006.01) |
| G11C 11/4094 | (2006.01) |
| G11C 11/56 | (2006.01) |
| G11C 16/26 | (2006.01) |

(Continued)

(52) U.S. Cl.
CPC ...... *G11C 11/4085* (2013.01); *G11C 11/4074* (2013.01); *G11C 11/4093* (2013.01); *G11C 11/4094* (2013.01); *G11C 11/5642* (2013.01); *G11C 16/26* (2013.01); *G11C 16/34* (2013.01); *G11C 16/0483* (2013.01); *G11C 2211/5642* (2013.01)

(58) Field of Classification Search
CPC ..... G11C 16/26; G11C 16/34; G11C 16/0483; G11C 2211/5642; G11C 11/4085; G11C 11/4074; G11C 11/4093; G11C 11/4094
See application file for complete search history.

(56) References Cited

U.S. PATENT DOCUMENTS 10,942,796 B2    3/2021    Miller
10,957,384 B1    3/2021    Hung
(Continued)

*Primary Examiner* — Mushfique Siddique
(74) *Attorney, Agent, or Firm* — Lowenstein Sandler LLP

(57) ABSTRACT

A device includes an array of memory cells with a first word line coupled to at least a subset of the array of memory cells and control logic coupled to the first word line. The control logic to detect, within a queue, a first read command to read first data from a first page of the subset and a second read command to read second data from a second page of the subset. The control logic is further to cause a voltage applied to the first word line to move to a target value. The control logic is further to cause a page buffer to sense the first data from a first bit line coupled to the first page and to sense the second data from a second bit line coupled to the second page. The control logic is further to cause the first word line to be discharged.

20 Claims, 18 Drawing Sheets

(51) Int. Cl.
  *G11C 16/34*    (2006.01)
  *G11C 16/04*    (2006.01)

(56) References Cited

U.S. PATENT DOCUMENTS

| | | | |
|---|---|---|---|
| 11,023,165 B2* | 6/2021 | Khon | G06F 11/1048 |
| 11,307,803 B2 | 4/2022 | Shin | |
| 2019/0087126 A1* | 3/2019 | Chun | G06F 3/0611 |
| 2022/0051714 A1* | 2/2022 | Bang | G11C 16/3418 |
| 2022/0084597 A1* | 3/2022 | Mun | G11C 16/24 |
| 2022/0093183 A1* | 3/2022 | Kim | G11C 16/30 |
| 2022/0197561 A1* | 6/2022 | Na | G06F 3/0604 |

* cited by examiner

1200

```
┌─────────────────────────────────────────────────────────┐
│ Detect, by control logic coupled to a first word line   │
│ and a queue within a memory device, a first read        │
│ command to read first data from a first page of a       │
│ subset of an array of memory cells.                     │
│ 1210                                                    │
└─────────────────────────────────────────────────────────┘
                            ↓
┌─────────────────────────────────────────────────────────┐
│ Access a second read command in the queue, the second   │
│ read command to read second data from a second page of  │
│ the subset of the array.                                │
│ 1220                                                    │
└─────────────────────────────────────────────────────────┘
                            ↓
┌─────────────────────────────────────────────────────────┐
│ Cause a voltage applied to the first word line to ramp  │
│ up to an initial value.                                 │
│ 1230                                                    │
└─────────────────────────────────────────────────────────┘
                            ↓
┌─────────────────────────────────────────────────────────┐
│ Cause the voltage applied to the first word line to     │
│ move to a target value to setup read operations.        │
│ 1240                                                    │
└─────────────────────────────────────────────────────────┘
                            ↓
┌─────────────────────────────────────────────────────────┐
│ Direct a page buffer to sense the first data from a     │
│ first bit line coupled to the first page of the subset  │
│ of the array.                                           │
│ 1250                                                    │
└─────────────────────────────────────────────────────────┘
                            ↓
┌─────────────────────────────────────────────────────────┐
│ Direct the page buffer to sense the second data from a  │
│ second bit line coupled to the second page of the       │
│ subset of the array.                                    │
│ 1260                                                    │
└─────────────────────────────────────────────────────────┘
                            ↓
┌─────────────────────────────────────────────────────────┐
│ Cause, by the control logic, the first word line to be  │
│ discharged.                                             │
│ 1270                                                    │
└─────────────────────────────────────────────────────────┘
```

Detect, by control logic coupled to a triple-level-cell (TLC) word line and a queue within a memory device, a set of first read commands to read first data from a first lower page of first TLCs of an array of memory cells.
1310

Access, in the queue, a set of second read commands to read second data from a second lower page of second TLCs of the array of memory cells.
1320

Cause a voltage applied to the TLC word line to ramp up to an initial value.
1330

Cause the voltage applied to the TLC word line to move to a target value to setup read operations.
1340

Direct a page buffer to sense a first portion of the first data from a first bit line coupled to the first lower page of the first TLCs of the array.
1350

Direct the page buffer to sense a second portion of the first data from a second bit line coupled to the first lower page of the first TLCs.
1360

Cause the voltage applied to the TLC word line to again move to the target value to again setup read operations.
1370

FIG. 13

READ-TIME OVERHEAD AND POWER OPTIMIZATIONS WITH COMMAND QUEUES IN MEMORY DEVICE

RELATED APPLICATIONS

The present application is a continuation of U.S. patent application Ser. No. 17/318,579, filed May 12, 2021 the entirety of which is incorporated by reference herein.

TECHNICAL FIELD

Embodiments of the disclosure are generally related to memory sub-systems, and more specifically, relate to read-time overhead and power optimizations with command queues in memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 12 is a flow diagram of an example method of performing a combined read operation to process two read commands of two single-level cells according to some embodiments.

FIG. 13 is a flow diagram of an example method of performing a combined read operation to process two read commands of a page of multiple triple-level cells according to some embodiments.

DETAILED DESCRIPTION

Figure 1A:
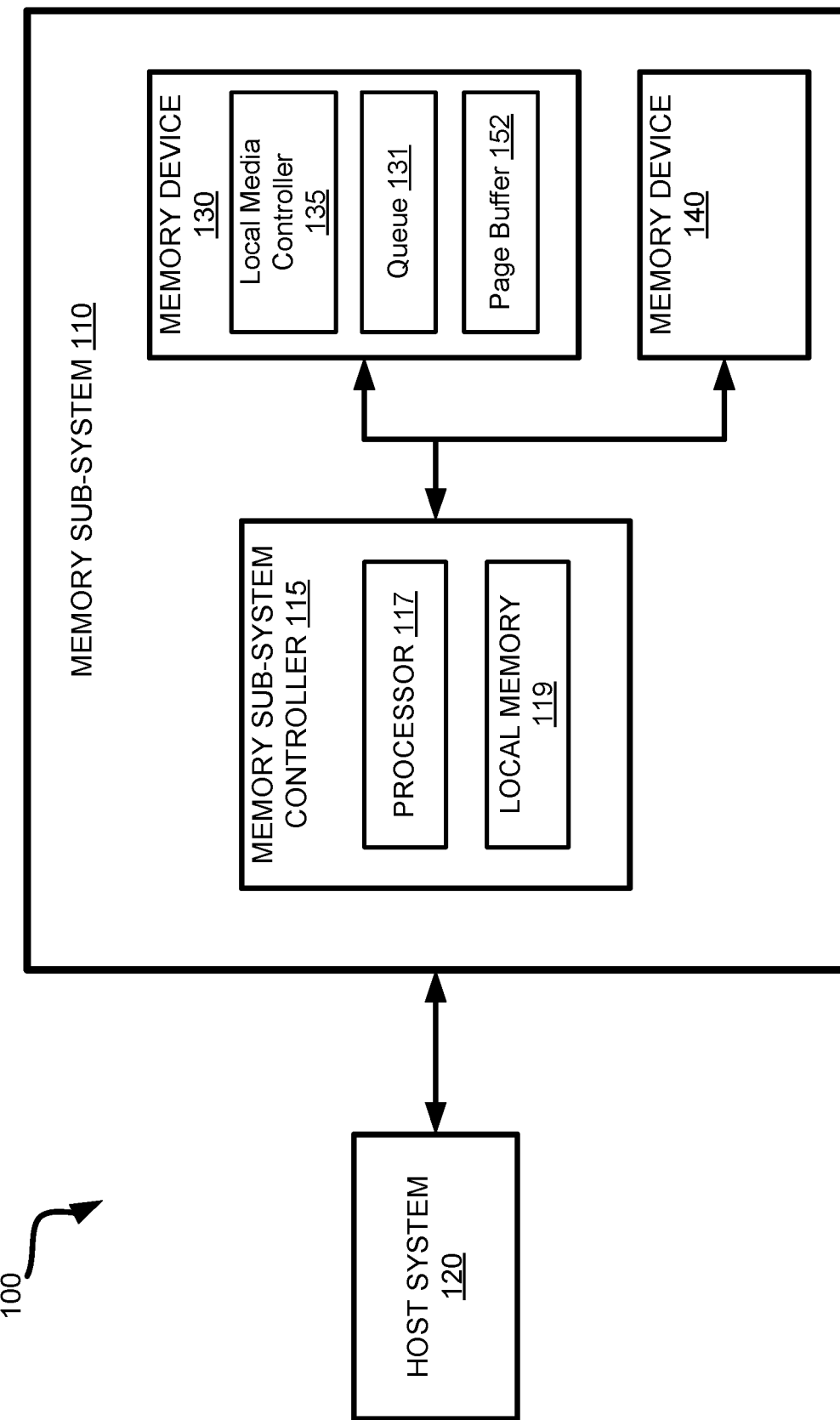
FIG. 1A illustrates an example computing system that includes a memory sub-system in accordance with some embodiments.

Embodiments of the present disclosure are directed to read-time overhead and power optimizations with command queues in memory. In certain memory devices, a memory sub-system controller includes a command queue in which commands from a host system, or that are generated locally by the memory sub-system controller, are buffered and handled generally in a first-in-first-out order. Such commands include erase commands to erase physical blocks of memory, write commands to program certain data to one or more dice (or planes) of a memory device (e.g., a page at a time), or read commands to read certain data out of the one or more dice (or planes) of the memory device (e.g., a page at a time). In these certain memory devices, as a read command comes to the top of the command queue, it is sent to a target die to read data from an address included in the read command.

In various embodiments, each read command includes a particular overhead, including a certain amount of time (e.g., "time period") for each of the following phases of a read operation. First, a time period for causing a voltage applied to all the word lines of the die to ramp up to an initial voltage. Second, a time period for causing the voltage applied to a selected word line to move to a target value that sets up the word line for read operations. Third, a time period to pre-charge a bit line coupled to a page (addressed in the read command) of an array of memory cells of the die of plane. Fourth, a time period to sense the data stored in the page, thus reading the data out into a latch or register of a page buffer. In some embodiments, the time period to pre-charge is eliminated in cases where the bit line is already charged or the sensing of the data involves a simultaneous charging sufficient to read the data of the memory cell. Fifth, a time period for recovery in which the word lines and bit line are discharged of previously applied voltages. Because these time periods apply to the handling of each read command by each target die, handling numerous read commands causes this time overhead to cumulate into a significant cumulative overhead.

Aspects of the present disclosure address the above and other deficiencies through employing a queue (e.g., command queue) stored in the die or in a plane of the memory device that is receiving commands to be processed. Because a subsequent read command to a current command being handled by the memory device is stored locally in the command queue, the memory device can perform a combined read operation that handles each of the current (or first) read command and the subsequent (or second) read command during the same (e.g., a combined) read operation. The present embodiments see particularly good overhead savings when the first and second read commands are consecutive read commands on the same word line. For example, in one embodiment, the first and second read commands are directed to two different memory cells coupled to the same word line.

In these embodiments, a memory device includes an array of memory cells that includes a first word line coupled to at least a subset of the array of memory cells. A queue can be located (or embodied) within the array as well, e.g., within the plane or die targeted by certain read commands. Control logic of the memory device can be coupled to the first word line and the queue. The control logic can be adapted to direct a combined read operation be performed generally as follows, but will be discussed in more detail later. The control logic can detect a first read command to read first data from a first page of the subset of the array. The control logic can access a second read command in the queue, the second read command to read second data from a second page of the subset of the array. The control logic can cause a voltage applied to the first word line to ramp up to an initial value and then cause the voltage applied to the first word line to move to a target value to setup read operations. The control logic can direct a page buffer to pre-charge a first bit line coupled to the first page of the subset of the array and to sense the first data. The control logic can direct the page buffer to pre-charge a second bit line coupled to the second page of the subset of the array and to sense the second data. The control logic can cause the first word line and the bit lines to be discharged.

In this way, the ramping up of the word line voltage, the moving the word line voltage to the target value, and the discharging the word line voltage phases can overlap for the two read commands, saving the overhead time associated with these actions in performing the combined read operation. The discharging of the word line can be part of a recovery period that involves a time between a time at which the data is ready to be read and when the next read command is started to be processed. In different embodiments, the combination in time savings of all three of these time periods involves savings of between a third and a half of an entire read operation time period. The overhead savings can be compounded where a combined read operation is performed for three, four, or more consecutive read commands directed to the same word line.

Therefore, advantages of the systems and methods implemented in accordance with some embodiments of the present disclosure include, but are not limited to, reducing the cumulative overhead time required to process read commands, particularly consecutive read commands in the queue that are directed to the same word line. Reducing overhead time for processing multiple read commands can be extended from being applied to reading from single-level cells (SLCs) to being applied to reading from triple-level cell (TLCs), quad-level cells (QLCs), and the like, as will be discussed in more detail. Some overhead time savings can also be seen in performing select combined read operations to process random read commands, as will also be discussed later. Other advantages will be apparent to those skilled in the art of read command handling optimization within a memory device discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a page buffer 152, which can provide the circuitry used to program data to the memory cells of the memory device 130 and to read the data out of the memory cells. The memory device 130 can further include a queue 131 (e.g., a command queue) stored within a memory array of the memory device 130, such as within a die or a plane of the memory device 130. In alternative embodiments, the queue 131 can be located on a local media buffer outside of the memory array. Control logic of the local media controller 135 can be adapted to read commands buffered within the queue 131, identify a subsequent command as being directed to the same word line as a current command being processed, and direct a combined read operation in which the current command and the subsequent command are processed at the same time, e.g., as part of the combined read operation.

Figure 1B:
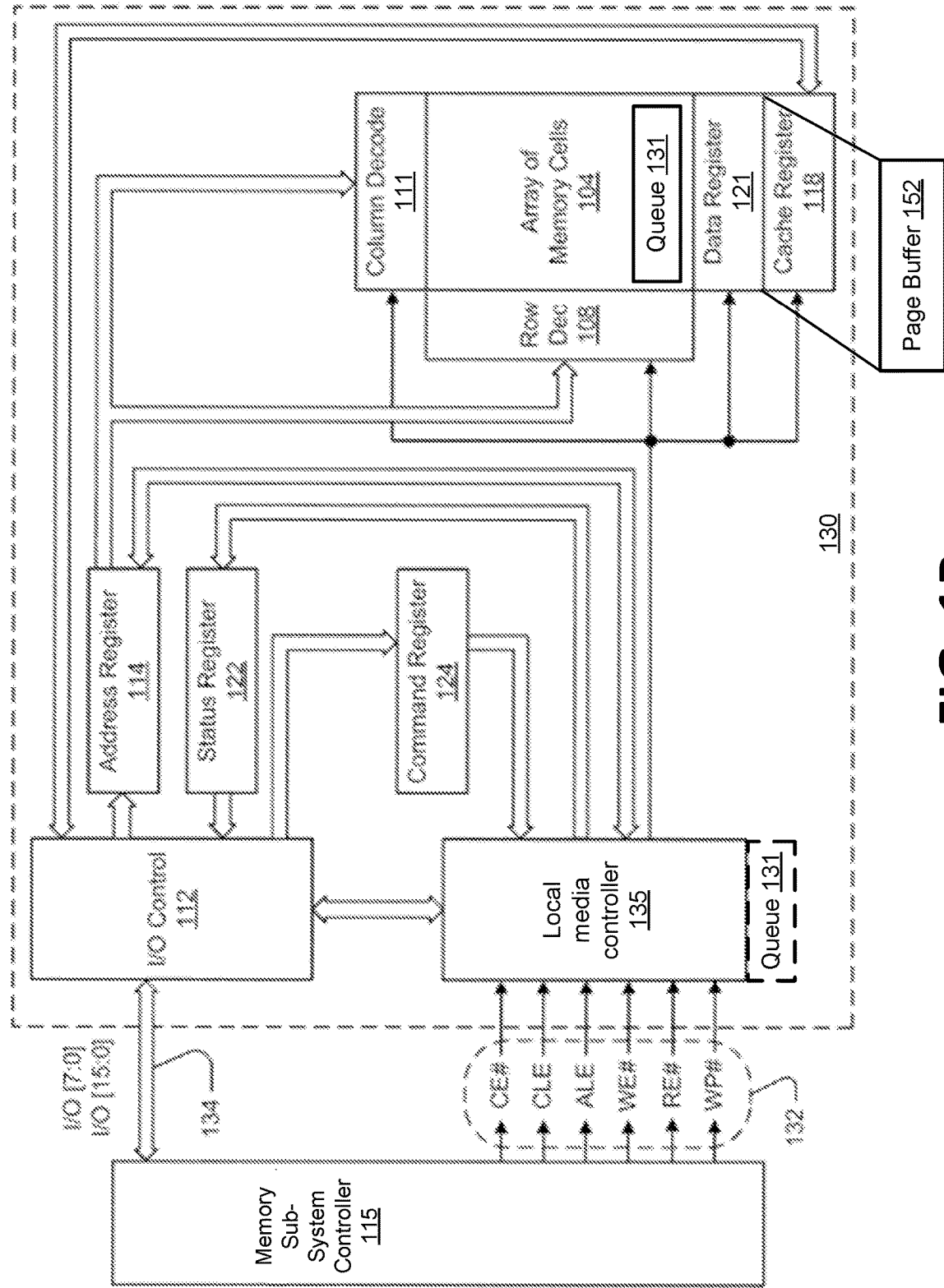
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states. In some embodiments, the array of memory cells 104 includes the queue 131 embodied within the memory cells of the array of memory cells 104. The queue 131 can also be located within a local media buffer or local memory of the local media controller 135 (illustrated in dash). The queue 131 can make reference to a command queue referred to herein.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
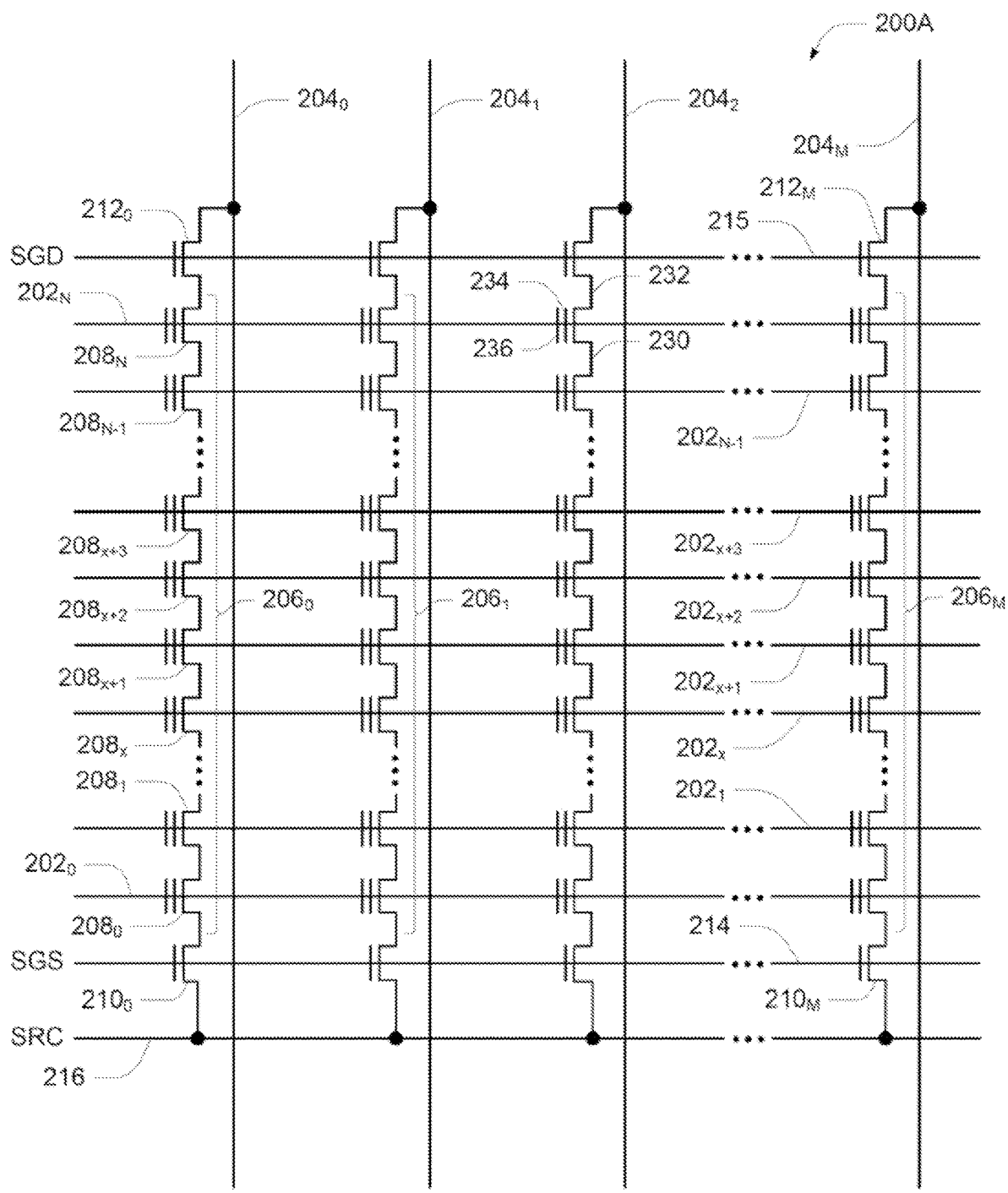
FIG. 2A-2C are schematics of portions of an array of memory cells as could be used in a memory of the type described with reference to FIG. 1B according to an embodiment.
Figure 2B:
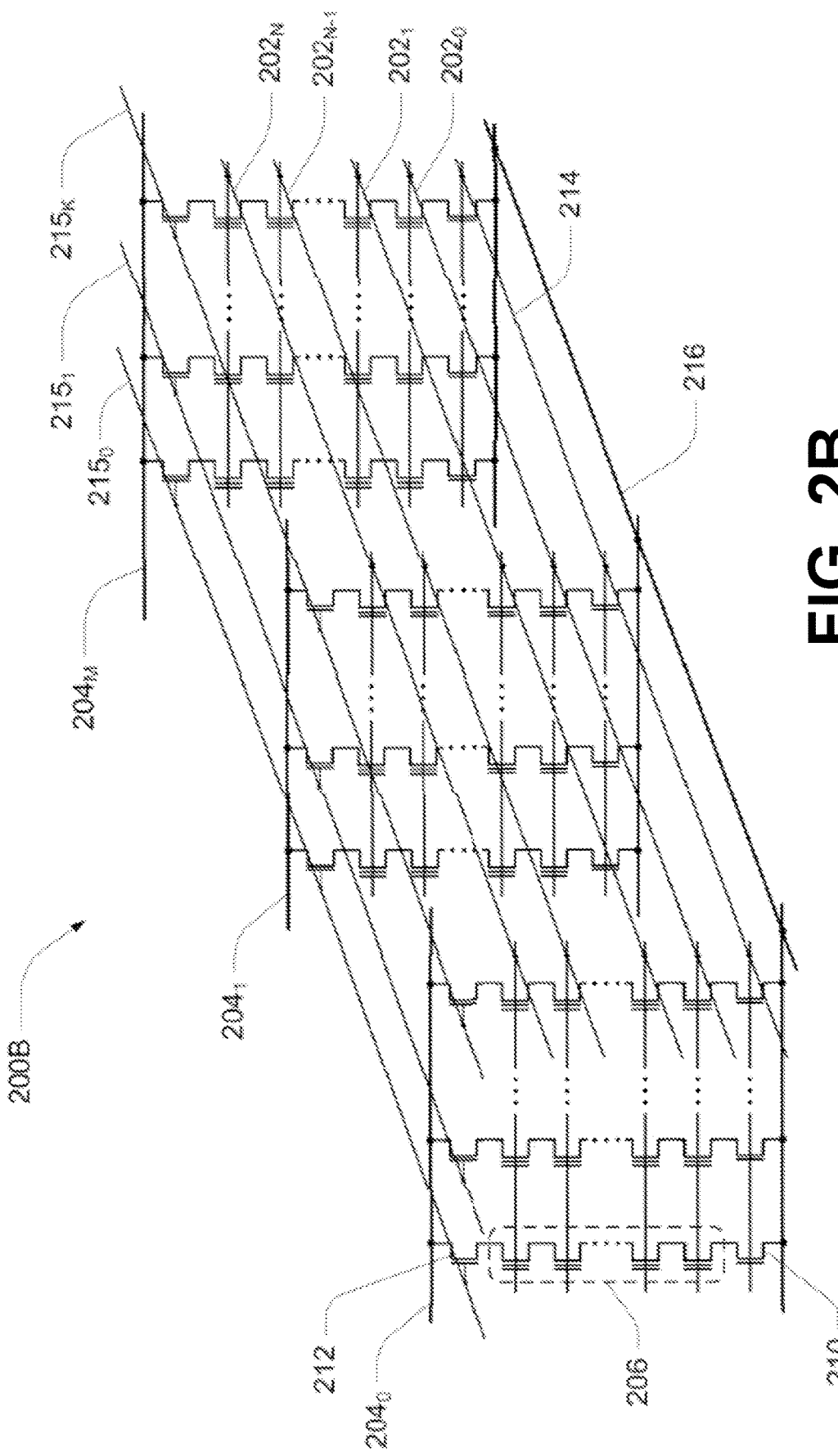
Figure 2C:
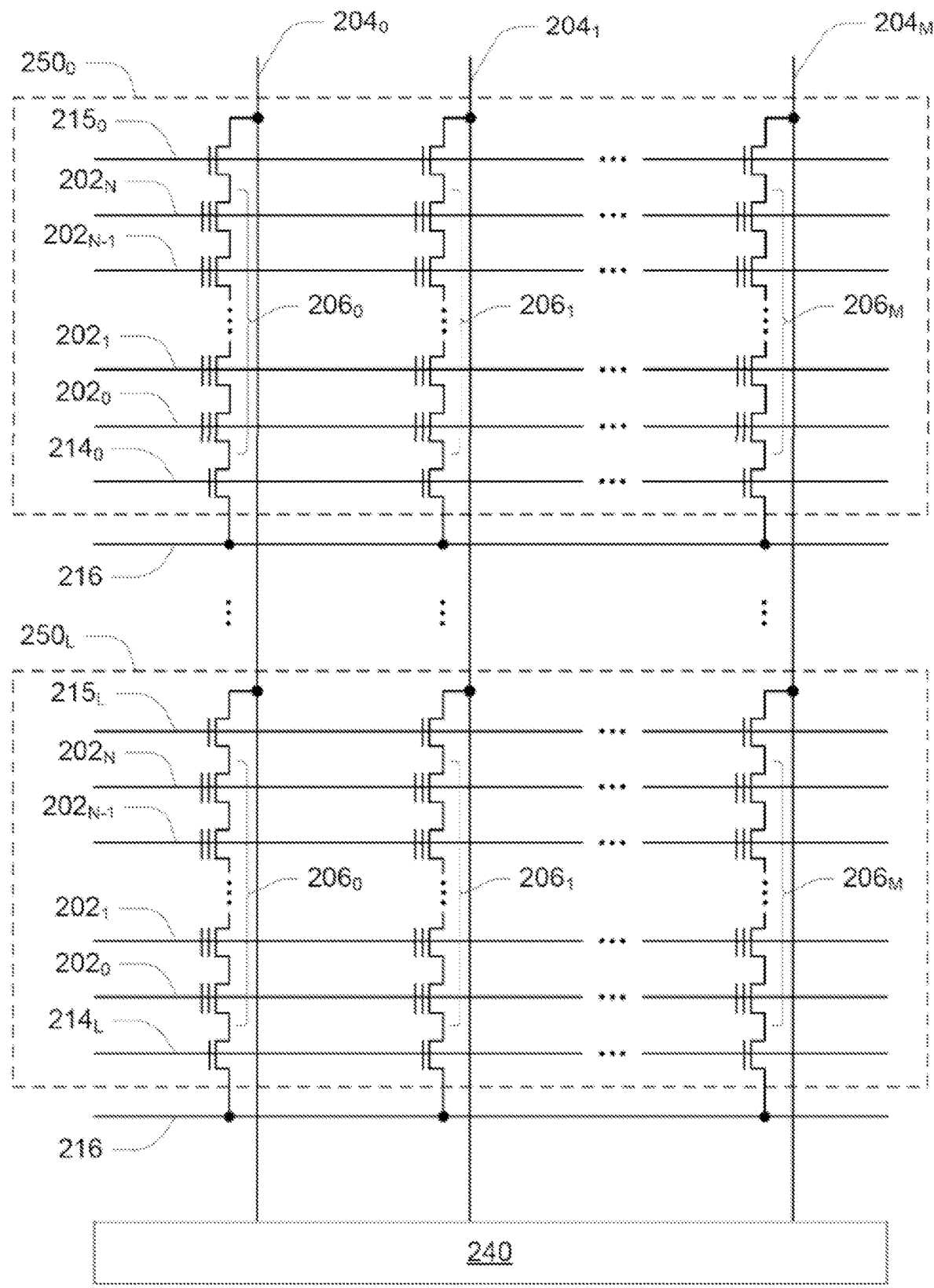

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines 2041, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bit lines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bit lines 204.

Figure 3:
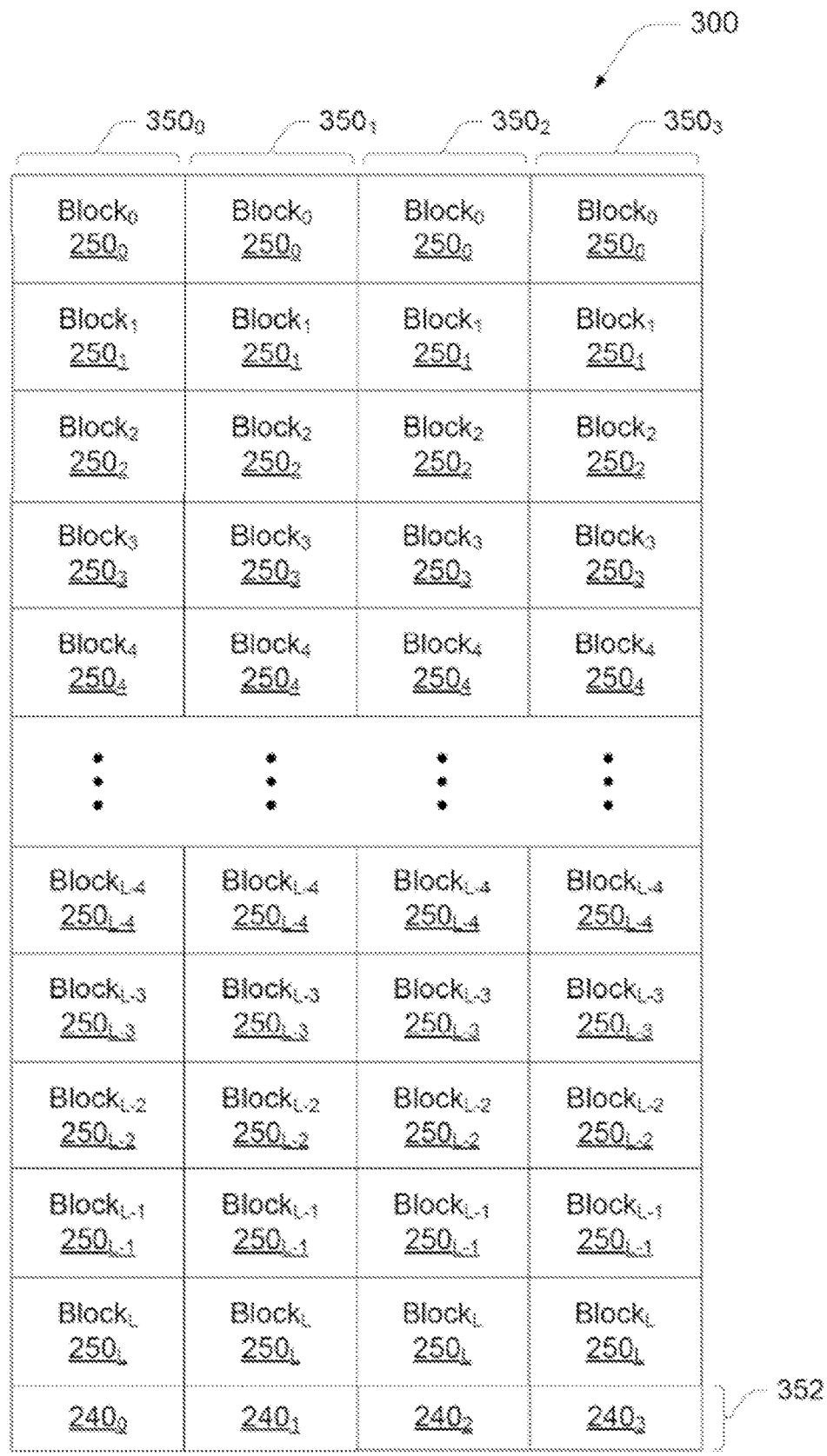
FIG. 3 is a block schematic of a portion of an array of memory cells as could be used in a memory of the type described with reference to FIG. 1B according to an embodiment.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
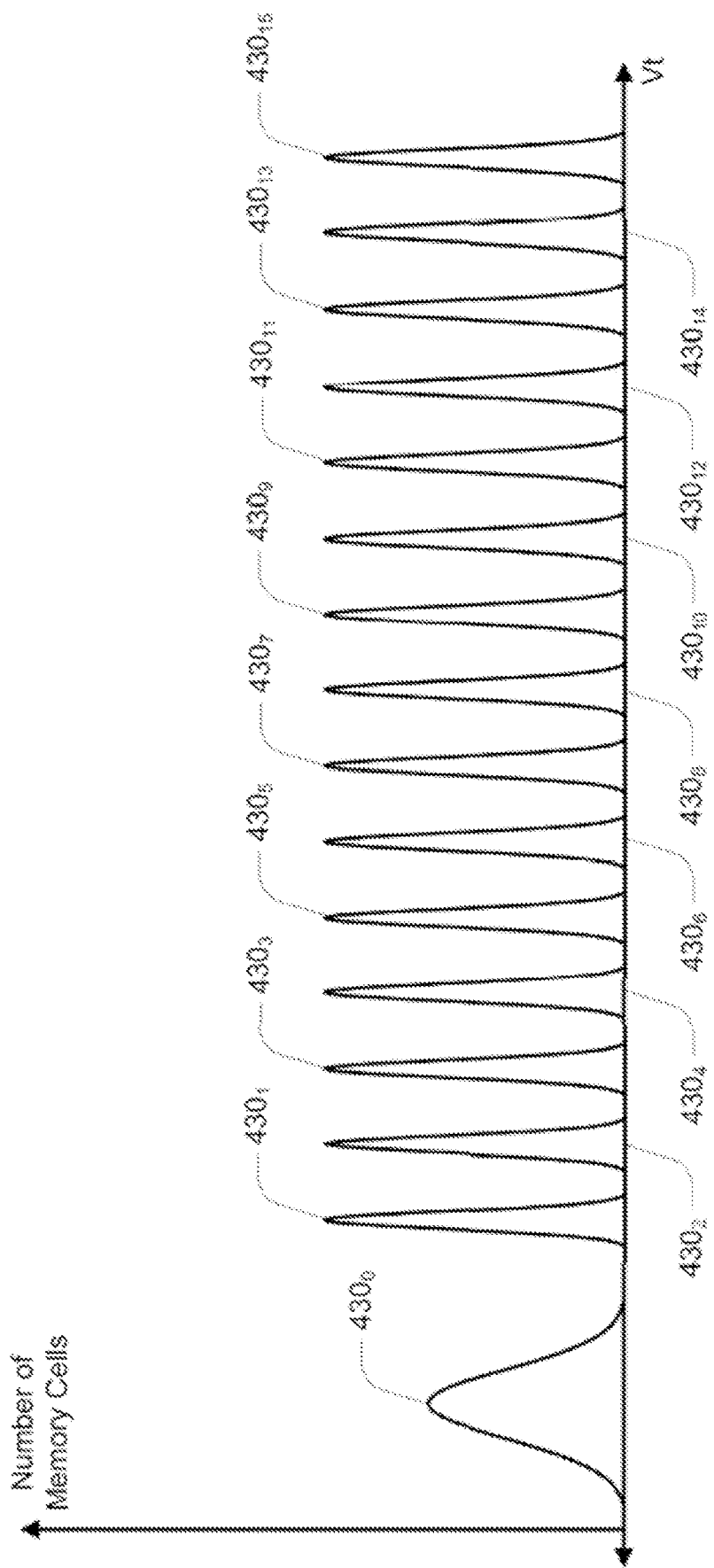
FIG. 4 is a conceptual depiction of threshold voltage distributions of multiple memory cells of a memory array according to an embodiment

FIG. 4 is a conceptual depiction of threshold voltage ranges of multiple memory cells. FIG. 4 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ can tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$, and $430_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case can be storing a data state L0 having a data value of logical '1111' and is typically referred to as the erased state of the memory cell. If the threshold voltage is within the second of the sixteen threshold voltage ranges $430_1$, the memory cell in this case can be storing a data state L1 having a data value of logical '0111'. If the threshold voltage is within the third of the sixteen threshold voltage ranges $430_2$, the memory cell in this case can be storing a data state L2 having a data value of logical '0011', and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5:
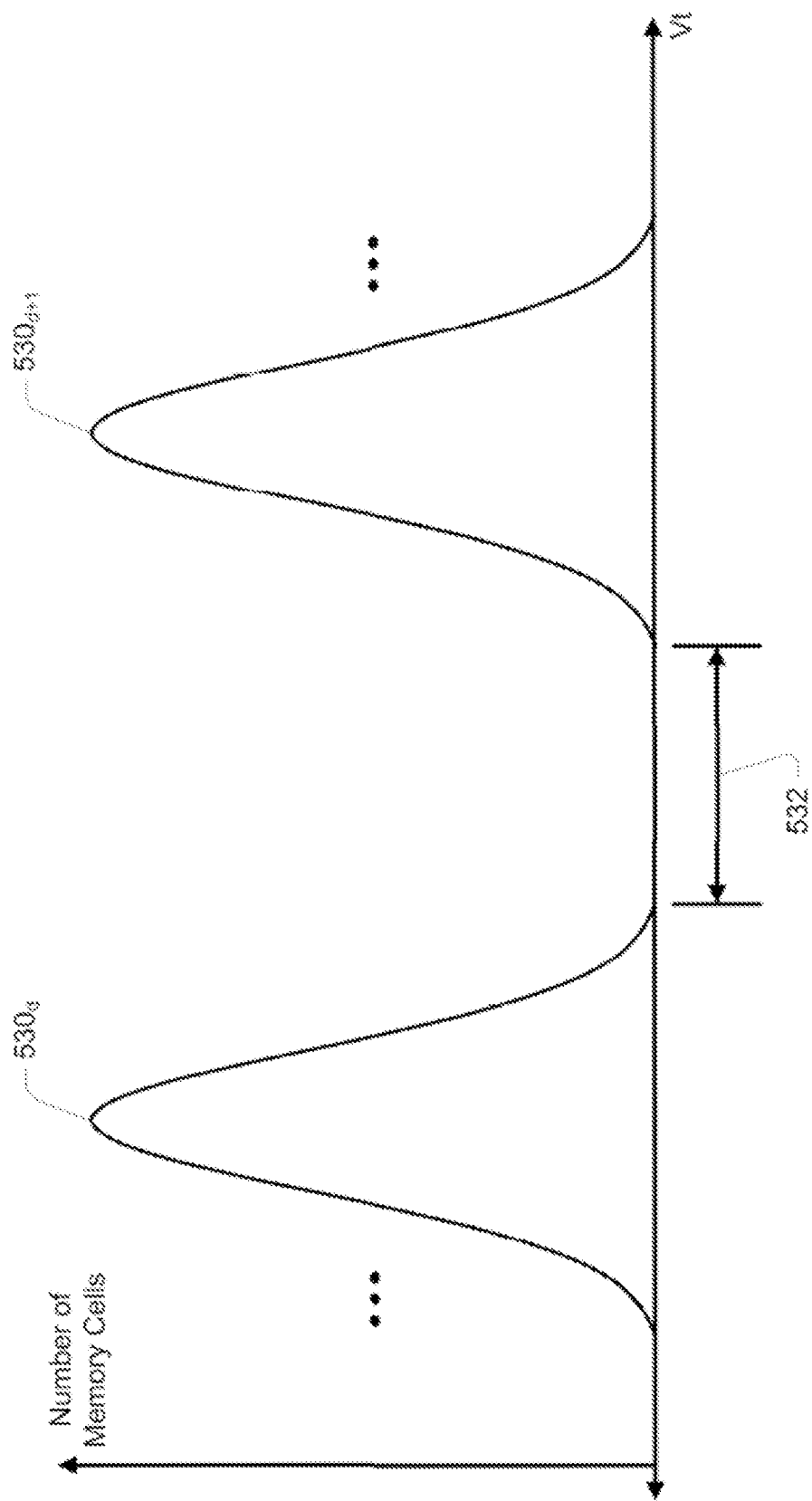
FIG. 5 is a conceptual depiction of a threshold voltage distribution of multiple memory cells at one stage following programming for use with various embodiments.

FIG. 5 is a conceptual depiction of a threshold voltage distribution of multiple memory cells following a programming operation. The threshold voltage distributions $530_d$-$530_{d+1}$ of FIG. 5 can represent some portion of the distributions for threshold voltage ranges $430_0$-$430_{15}$ of FIG. 4 at the completion of a programming operation for memory cells. With reference to FIG. 5, adjacent threshold voltage distributions 530 are typically separated by some margin 532 (e.g., dead space) at the completion of programming. Applying a sense voltage (e.g., read voltage) within the margin 532 to the control gates of the multiple memory cells can be used to distinguish between the memory cells of the threshold voltage distribution $530_d$ (and any lower threshold voltage distribution) and the memory cells of the threshold voltage distribution $530_{d+1}$ (and any higher threshold voltage distribution).

Figure 6:
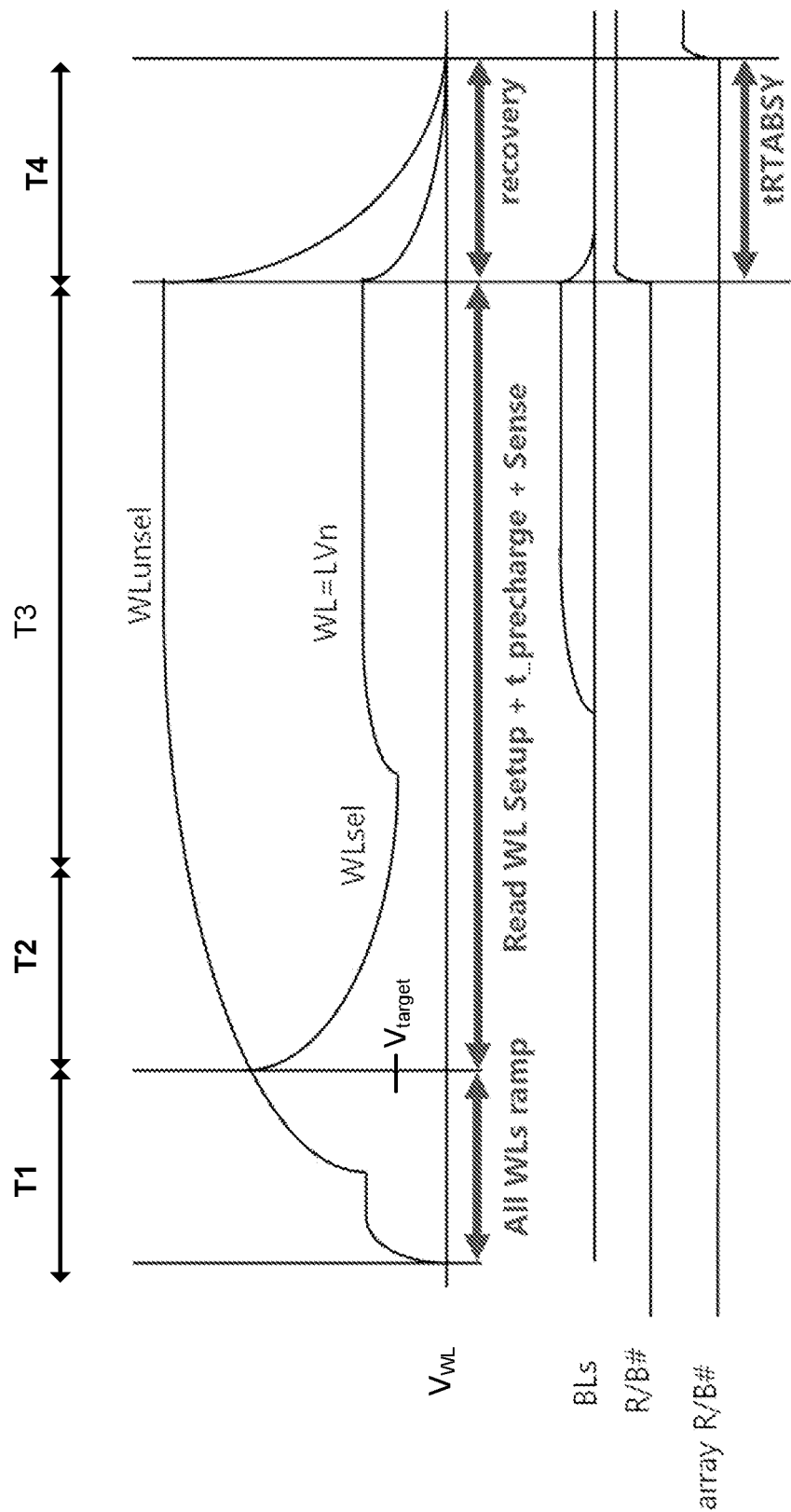
FIG. 6 is a graph illustrating voltage waveforms associated with a single read command of a single-level cell in certain memory devices according to an embodiment.

FIG. 6 is a graph illustrating voltage waveforms associated with a single read command of a single-level cell in certain memory devices according to an embodiment. For example, each read command includes a particular overhead, including a certain amount of time for each of the following phases of a read operation. During a first time period (T1), control logic (e.g., of the local media controller 135) causes a voltage applied to all the word lines of a plane or die to ramp up to an initial voltage. During a second time period (T2), the control logic causes the voltage applied to a selected word line (WLsel) to move to a target value ($V_{target}$) that sets up the word line for read operations. Also, during the second time period (T2), the control logic causes unselected word lines (WLunsel) to continue increasing in voltage to be able to turn on a NAND string (e.g., NAND string 206) if selected.

With further reference to the embodiment of FIG. 6, during a third time period (T3), the control logic causes pre-charging of a bit line (BL) coupled to a page (addressed in the read command) of an array of memory cells of the die or plane. The control logic can also, of course, cause pre-charging of a set of BLs associated with the page. Further, during the third time period, the control logic causes a page buffer to sense the data stored in the page, thus reading the data out into a latch or register of the page buffer. In some embodiments, the third time period does not include a pre-charge in cases where the bit line is already charged or the sensing of the data involves a simultaneous charging sufficient to read the data of the memory cell. The pre-charging as a specific or separate operation may therefore be viewed as optional, although illustrated and discussed throughout this disclosure. Finally, during a fourth time period (T4), the control logic causes the selected and unselected word lines and the bit lines to discharge for purposes of recovery before another read command of the array can be processed. Also, during the fourth time period, a control signal (R/B #) identifying the word line moves to a high value, indicating that the memory device is ready for a new command (as opposed to being busy). Further, during the fourth time period, a read port (array R/B #) of the array of memory cells (coupled to the word lines and bit lines) is indicated as having data ready to be read before the next read command is started to be processed. In one embodiment, this read port is on the die currently being read.

Figure 7:
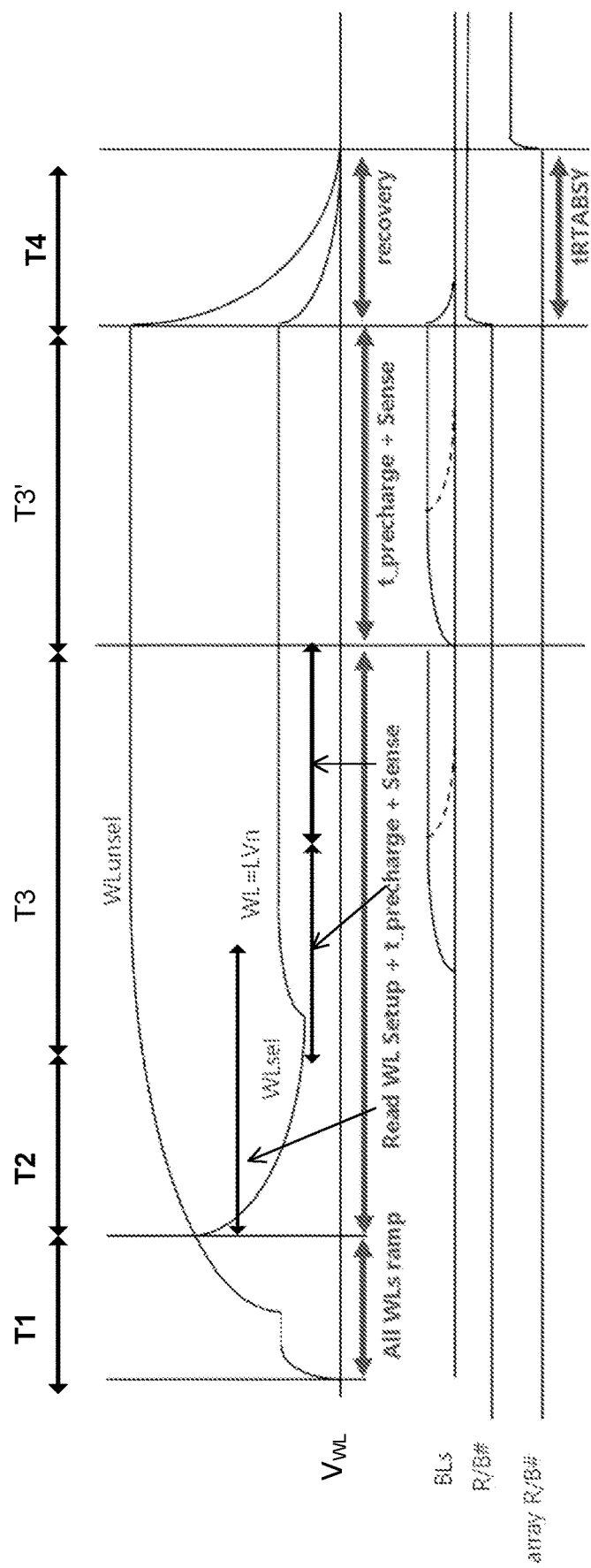
FIG. 7 is a graph illustrating voltage waveforms associated with a combined read operation to process two read commands of two single-level cells of a memory device according to an embodiment.

FIG. 7 is a graph illustrating voltage waveforms associated with a combined read operation to process two read commands of two single-level cells of a memory device according to an embodiment. Thus, in some embodiments, a word line selected in FIG. 7 is a single-level-cell word line. While the second time period (T2) can take more time than indicated, the second time period as labeled excludes any overlap into the third time period (T3) because the third time period is to be repeated for processing a subsequent command. In one embodiment, only the third time period is repeated, indicated by T3', in order to process a second read command. Thus, during the T3' time period, the control logic optionally pre-charges at least a second bit line (BL) coupled to a second page (addressed in a second read command retrieved from the queue 131) of the array of memory cells of the die or plane. Further, during the T3' time period, the control logic causes a page buffer to sense second data stored in the second page, thus reading the second data out into a latch or register of the page buffer. These third time periods T3 and T3' can be different lengths. For example, in one embodiment, the T3 time period is shorter than the T3' by between 1-4 microseconds (µs). In the embodiment of FIG. 7, the fourth time period (T4), which is set aside for recovery, instead follows the second third time period, or T3'.

In one embodiment, with further reference to FIG. 6 and FIG. 7, T1 is approximately 10 microseconds (µs), T2 is approximately 5.9 µs, T3 is approximately 14.4 µs, T3' is approximately 18.1 µs, and T4 is approximately 6.8 µs. Thus, in embodiments where the first, second, and fourth time periods overlap for a combined read operation, a total of approximately 22.7 µs is saved in time overhead when processing two read commands as a combined read operation. These are estimated values for time overhead reductions; different and varied time values for these time periods are anticipated in other embodiments or other-sized memory cells. This time savings can be seen as approximately 55% for reading a second SLC. Because time periods T1 through T4 apply to the handling of each read command by each target die, combining three or more read commands into a single read operation is expected to significantly increase time overhead reductions.

Figure 8:
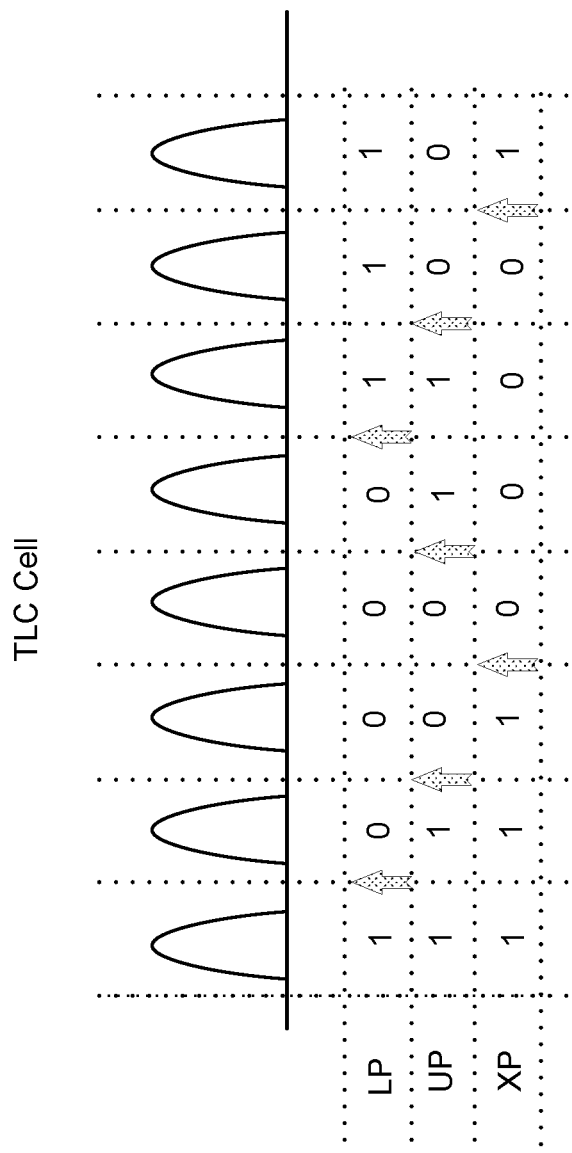
FIG. 8 is a graph illustrating threshold voltage distributions associated with three possible pages to which a triple-level cell of a memory device can be programmed according to an exemplary embodiment.

FIG. 8 is a graph illustrating threshold voltage distributions associated with three possible pages to which a triple-level cell (TLC) of a memory device can be programmed according to an exemplary embodiment. These three pages include a lower page (LP), an upper page (UP), and an extra page (UP), each having eight voltage distributions within which multiple TLCs can be programmed. As can be observed, to read data out of these three pages from the multiple TLCs, two read commands are processed for the LP, three read commands are processed for the UP, and two read commands are processed for the XP. Because a single word line can be coupled to the multiple TLC pages, a word line can be coupled to more than one TLC. Thus, the present disclosure can be applied to reading data out of two LPs of two different TLCs, out of two UPs of two different TLCs, or out of two XPs of the two different TLCs in a combined read operation.

Also, as will be discussed with reference to FIGS. 9A-9B, performing a combined read operation as disclosed herein can be performed in processing consecutive read commands associated with reading data out of one of the pages of the multiple TLCs. Thus, in some embodiments, the selected word line of FIG. 7 is a triple-level-cell word line, the first read command is to perform a first read operation of a lower page of the multiple TLCs, and the second read command is to perform a second read operation of the lower page. In other embodiments, the first read command is to perform a first read operation of an extra page of the multiple TLCs, and the second read command is to perform a second read operation of the extra page. In a further embodiment, the first read command is to perform a first read operation of one of a lower page or an upper page of the multiple TLCs, and the second read command is to perform a second read operation of the one of the lower page or the upper page.

Figure 9A:
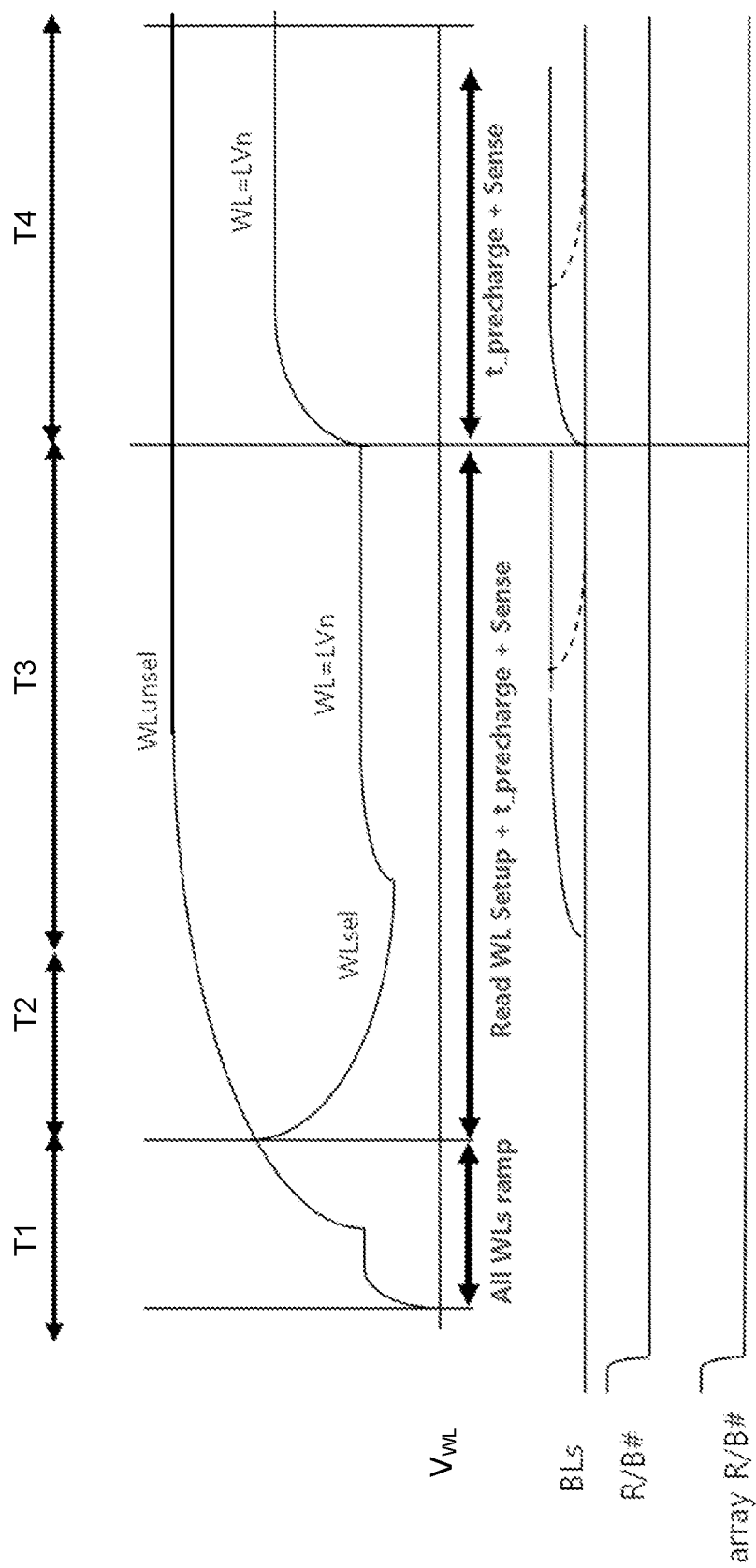
FIGS. 9A-9B are a graph illustrating voltage waveforms associated with a combined read operation to process multiple read commands for pages from multiple triple-level cells of a memory device according to an embodiment.
Figure 9B:
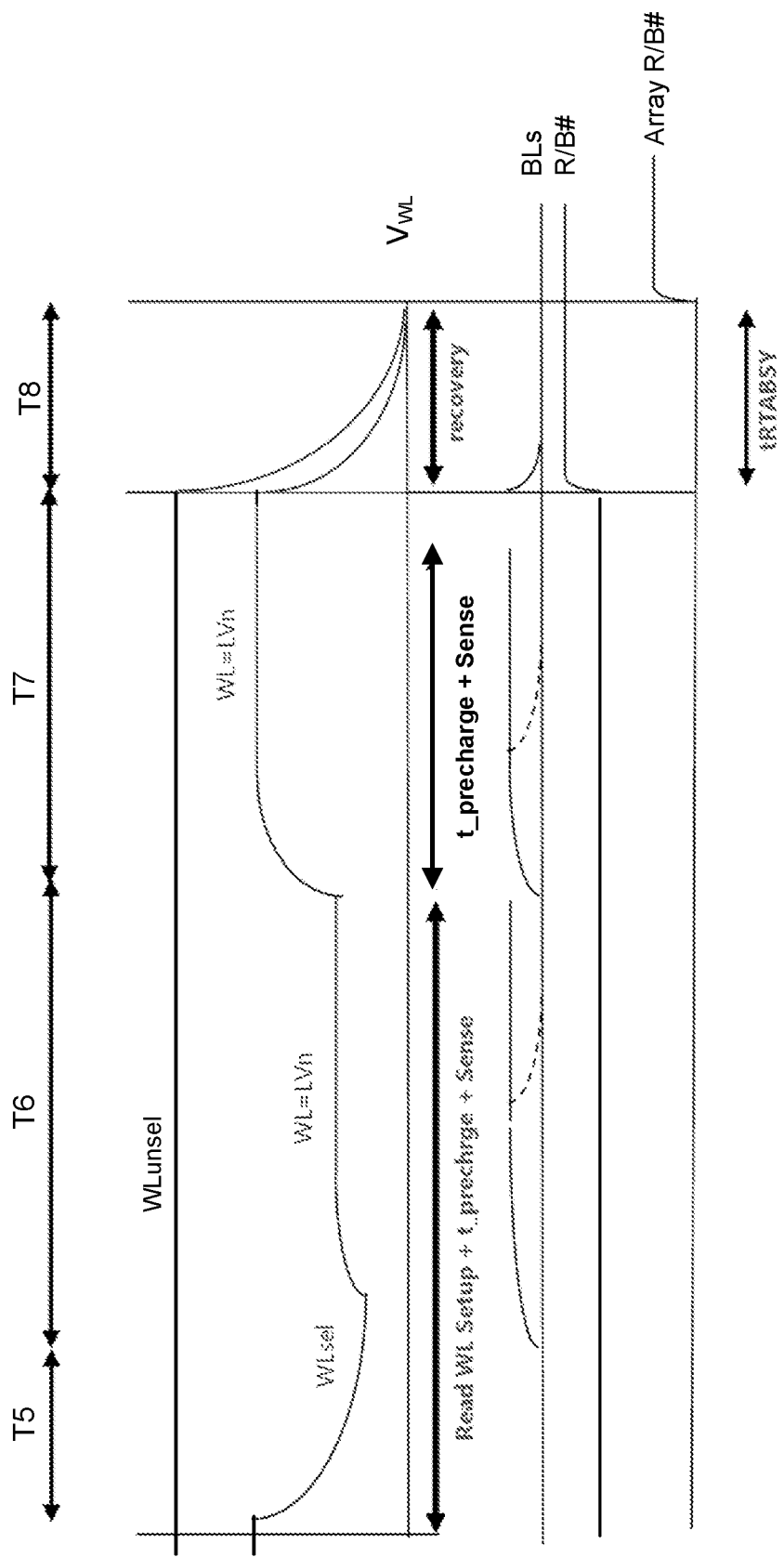

FIGS. 9A-9B are a graph illustrating voltage waveforms associated with a combined read operation to process multiple read commands of pages from multiple triple-level cells (TLCs) of a memory device according to an embodiment. As discussed with reference to FIG. 8, these multiple read commands can be two reads commands for the lower page, the upper page, or the extra page of the multiple TLCs. The waveforms of FIGS. 9A-9B are illustrative of execution of a combined read operation directed at any two pages of multi-level cells, e.g., MLCs, QLCs, PLCs and the like. In various embodiments, the waveforms step through eight time periods, the first four time periods being those that can overlap with the four time periods discussed with reference to FIG. 7.

More specifically, the control logic can detect a set of first read commands to read first data from a first lower page of first TLCs of an array of memory cells. The control logic can further access a set of second read commands to read second data from a second lower page of second TLCs of the array of memory cells. The first set of read commands can be processed in a first combined read operation via the first four time periods illustrated FIG. 9A. In this TLC embodiment, the control logic causes a voltage applied to the TLC word line to ramp up to an initial value during the first time period (T1). The control logic causes the voltage applied to the TLC word line to move to a target value to setup read operations during the second time period (T2). The control logic directs a page buffer to optionally pre-charge a first bit line coupled to the first lower page of the first TLCs of the array and to sense a first portion of the first data during the third time period (T3). As with reference to FIG. 7, the second and third time periods may have overlap, but are illustrated without overlap for purposes of simplicity and so that the third and fourth time periods are comparable. Further, the control logic directs the page buffer to optionally pre-charge a second bit line coupled to the first lower page of the first TLCs and to sense a second portion of the first data during the fourth time period (T4).

With additional reference to FIG. 9B, according to some embodiments, the control logic can process the second set of read commands in a second half of the combined read operation of FIGS. 9A-9B. In these embodiments, the control logic causes the voltage applied to the TLC word line to again move to the target value to again setup read operations during a fifth time period (T5). The control logic further directs the page buffer to optionally pre-charge a third bit line coupled to the second lower page of the second TLCs of the array and to sense a first portion of the second data during a sixth time period (T6). The control logic can further direct the page buffer to optionally pre-charge a fourth bit line coupled to the second lower page of the second TLCs of the array and to sense a second portion of the second data during a seventh time period (T7). Finally, the control logic can cause the TLC word line to be discharged, in addition causing the unselected word lines and the bit lines to be discharged during a recovery or eighth time period (T8). Because four read commands were processed that were directed to the same word line, the first and eighth time periods were employed only once (in lieu of four times) and the second time period was employed only twice, as T2 and T5, in lieu of four times, enabling a significant reduction in time overhead to read out two LPs of multiple TLCs (or two UPs or two XPs of the multiple TLCs).

Figure 10:
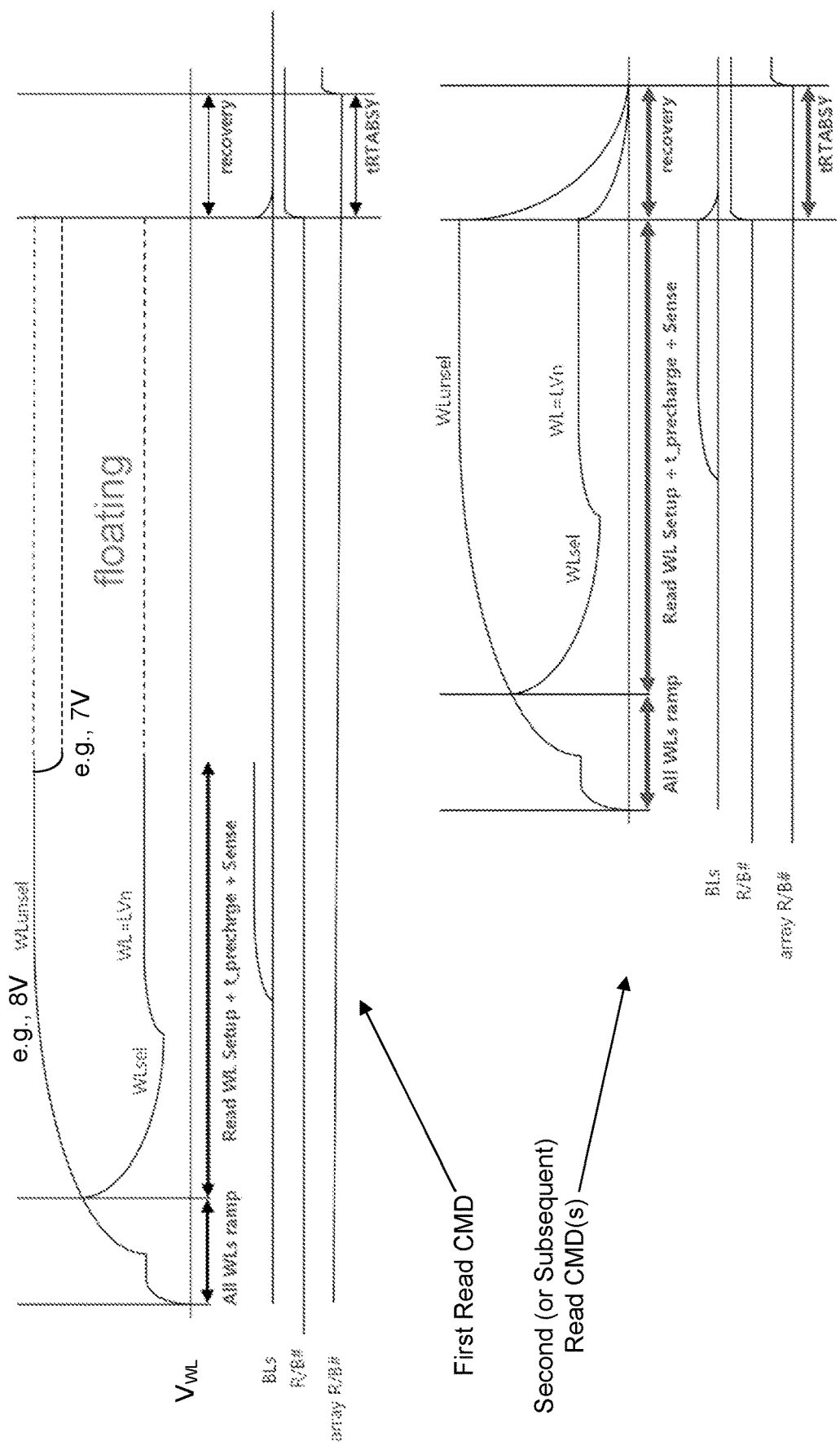
FIG. 10 is a graph illustrating voltage waveforms associated with performing a combined read operation to process two read commands that are directed to different blocks in a plane of a memory device according to an embodiment.

FIG. 10 is a graph illustrating voltage waveforms associated with performing a combined read operation to process two read commands that are directed to different blocks in a plane of a memory device according to an embodiment. While the embodiment of FIG. 10 is similar to that of FIG. 7, it differs in the consecutive read commands (from the queue 131) not being directed to the same word line. Thus, after processing the first read command (as per FIG. 6), the control logic can cause the unselected and selected word lines to float while a second read command directed to another block of the plane is processed (as per FIG. 6). Thus, the data can be read out during the combined read operation and the multiple word lines (associated with both pages of the two different read commands) and the bit lines that were pre-charged can be discharged at the same time. This can save the time required by the recovery period for the second (or any subsequent) read command.

If unselected word lines are kept at a high voltage (due to the floating word line(s)), then the memory cells in blocks which are selected before are put under stress, which can cause a read disturb in those memory cells. Thus, before moving to read from a next block, to mitigate potential read disturb impact on nearby cells, the control logic can discharge the word line(s) slightly, e.g., from 8 V to 7 V in one embodiment. The chance of a read disturb can be further mitigated by causing a recovery operation be performed after a threshold number of consecutive read commands are performed across multiple word lines. The control logic can further turn off a block selector with no time penalty.

Figure 11:
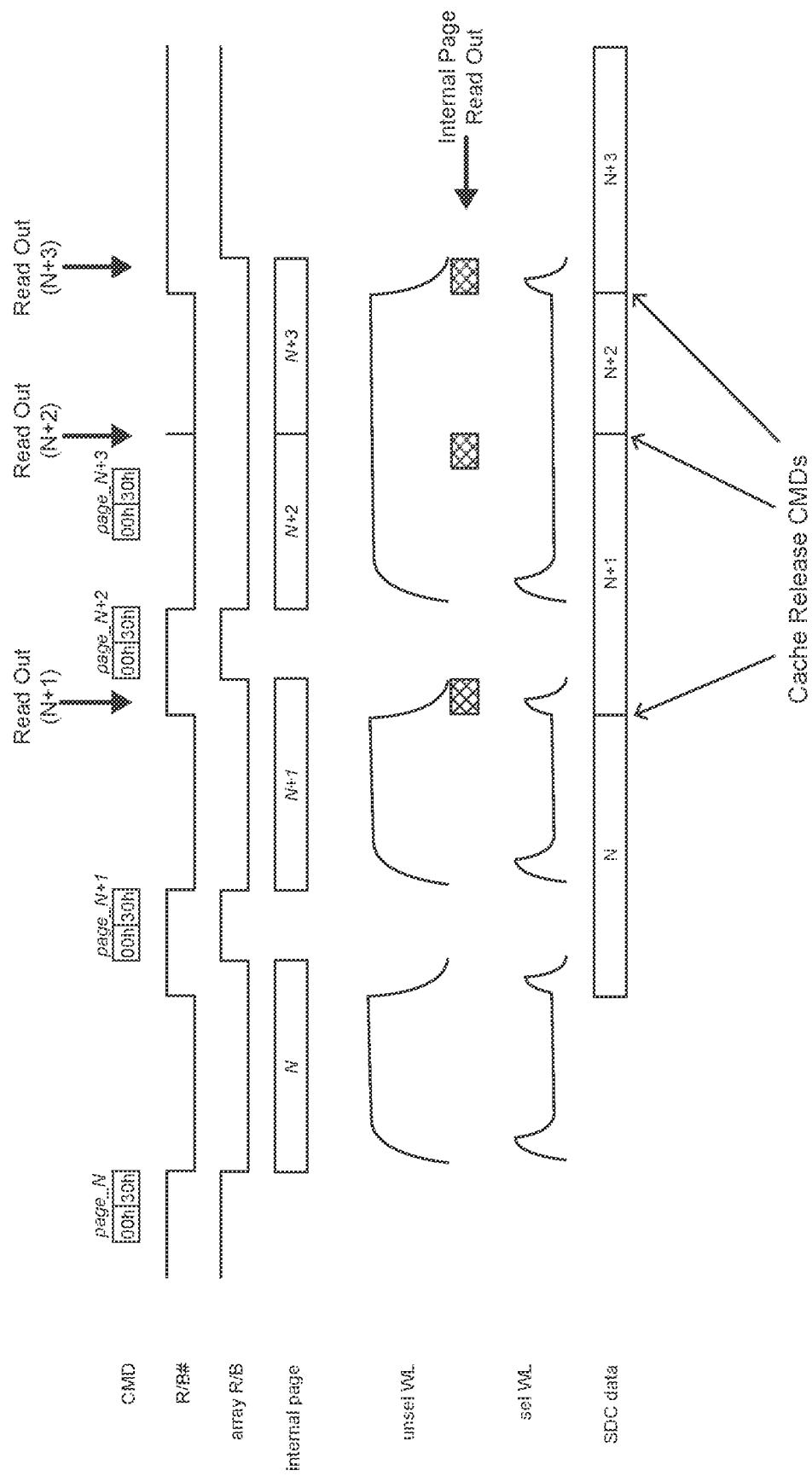
FIG. 11 is a graph illustrating command timing waveforms associated with voltage waveforms that process single read commands and a combination read operation of multiple read commands according to an embodiment.

FIG. 11 is a graph illustrating command timing waveforms associated with voltage waveforms that process single read commands and a combination read operation of multiple read commands according to an embodiment. In one embodiment, by way of example only, the control logic can direct a first read operation to retrieve page_N, a second read operation to retrieve page_N+1, and a combined third read operation to retrieve page_N+2 and page_N+3. The values for each incoming read command, R/B #, array R/B, the internal page data, the unselected WLs, the selected WL, secondary data cache (SDC) data, and primary data cache (PDC) data are illustrated as control signal waveforms, voltage waveforms, and block waveforms, respectively, as illustrated. In various embodiments, the controller 115 sends the read commands (30h) to the control logic (e.g., the local media controller 135) of the memory device 130 in lieu of interleaving read commands (30h) with cache commands (31h).

In this way, the control logic is allowed to more independently control the cache (associated with page buffers 152 and 352) and the control sequence is simplified, enabling data transfer to be hidden within WL recovery periods. The memory device 130 management of internal data movement can be dynamic, based on latch availability, for example, as will be explained. Further, the PDC can be left out of the data transfer.

As illustrated in FIG. 11, the internal pages can be read out of the memory cells during the recovery periods, enabling data transfer to be hidden during this time period. The data stored in the latches of SDC can be transferred out of the memory device 130 sometime later. Because the transfer of the SDC data off the die is performed when the select gate has been clocked out, the controller 115 can send a cache release command to the die when the select gate has been clocked out and the particular SDC latch is then freed for use to store new data from the die. In this way, read data clock out can be decoupled from presentation of subsequent command (unlike how cache management is usually handled).

Thus, with additional reference to FIG. 7, the control logic can further receive a first cache release command associated with a latch of the page buffer and cause the first data to be stored in the latch of the page buffer. The control logic can further receive a second cache release command associated with the latch and cause the second data to be stored in the latch of the page buffer. These actions can be taken with reference to the memory device 130 transferring data out of cache to free up latches (of the SDC) for storing additional data being read out of the array of memory cells. In one embodiment, the second cache release command is received after the first cache release command.

Further, with additional reference to FIGS. 9A-9B, after the first four time periods, the control logic can further receive a first cache release command associated with a latch of the page buffer, cause the first portion of the first data to be stored in the latch, receive a second cache release command associated with the latch of the page buffer, and cause the second portion of the first data to be stored in the latch. In one embodiment, the second cache release command is received after the first cache release command. Additionally, after the second four time periods, the control logic can further receive a third cache release command associated with a latch of the page buffer, cause the first portion of the second data to be stored in the latch, receive a fourth cache release command associated with the latch of the page buffer, and cause the second portion of the second data to be stored in the latch. In one embodiment, the fourth cache release command is received after the third cache release command. In this way, the same page buffer and latch can be shared in reading data out of the SDC.

FIG. 12 is a flow diagram of an example method 1200 of performing a combined read operation to process two read commands of two single-level cells according to some embodiments. The method 1200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1200 is performed by the local media controller 135 of FIGS. 1A-1B coupled to a page buffer, e.g., the page buffer 152 and to a queue, e.g., the queue 131. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1210, a first command is detected. For example, the processing logic detects a first read command to read first data from a first page of a subset of an array of memory cells. The array of memory cells can be coupled to a first word line and the queue that was previously mentioned.

At operation 1220, a second command is accessed. For example, the processing logic accesses a second read command in the queue, the second read command to read second data from a second page of the subset of the array. In some embodiments, the second read command is consecutive to the first read command in the queue.

At operation 1230, a voltage is ramped up. For example, the processing logic causes a voltage applied to the first word line to ramp up to an initial value.

At operation 1240, the voltage is moved. For example, the processing logic causes the voltage applied to the first word line to move to a target value to setup read operations.

At operation 1250, a bit line is sensed. For example, the processing logic directs a page buffer to sense the first data from a first bit line coupled to the first page of the subset of the array. In some embodiments, the processing logic also first directs the page buffer to pre-charge the first bit line before sensing the first data.

At operation 1260, another bit line is sensed. For example, the processing logic directs the page buffer to sense the second data from a second bit line coupled to the second page of the subset of the array. In some embodiments, the processing logic also first directs the page buffer to pre-charge the second bit line before sensing the second data.

At operation 1270, the word line is discharged. For example, the processing logic causes the first word line and the bit lines to be discharged. In various embodiments, the causing the voltage applied to the first word line to ramp up, the causing the voltage applied to the first word line to move to the target value, and the causing the first word line to be discharged are performed only once in processing both the first read command and the second read command.

FIG. 13 is a flow diagram of an example method 1300 of performing a combined read operation to process two read commands of a page of multiple triple-level cells according to some embodiments. The method 1300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1300 is performed by the local media controller 135 of FIGS. 1A-1B coupled to a page buffer, e.g., the page buffer 152 and to a queue, e.g., the queue 131. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1310, a first command is detected. For example, processing logic detects a set of first read commands to read first data from a first lower page of first TLCs of an array of memory cells. The first TLC can be coupled to a triple-level-cell (TCL) word line and the queue.

At operation 1320, a second command is accessed. For example, the processing logic accesses a set of second read commands in the queue to read second data from a second lower page of second TLCs of the array of memory cells. In one embodiment, the second set of read commands are consecutive to the first set of read commands.

At operation 1330, a voltage is ramped up. For example, the processing logic causes a voltage applied to the TLC word line to ramp up to an initial value.

At operation 1340, the voltage is moved. For example, the processing logic causes the voltage applied to the TLC word line to move to a target value to setup read operations.

At operation 1350, a bit line is sensed. For example, the processing logic directs a page buffer to sense a first portion of the first data from a first bit line coupled to the first lower page of the first TLCs of the array. In some embodiments, the processing logic also directs the page buffer to pre-charge the first bit line before sensing the first portion of the first data.

At operation 1360, another bit line is sensed. For example, the processing logic directs the page buffer to sense a second portion of the first data from a second bit line coupled to the first lower page of the first TLCs. In some embodiments, the processing logic also directs the page buffer to pre-charge the second bit line before sensing the second portion of the first data.

At operation 1370, the word line is discharged. For example, the processing logic causes the voltage applied to the TLC word line to again move to the target value to again setup read operations. In other embodiments, the method 1300 is applied to upper pages (UPs) of the multiple TLCs or is applied to extra pages (XPs) of the multiple TLCs.

In further embodiments, the processing logic directs the page buffer to pre-charge a third bit line coupled to the second lower page of the second TLCs of the array and to sense a first portion of the second data. The processing logic directs the page buffer to pre-charge a fourth bit line coupled to the second lower page of the second TLCs of the array and to sense a second portion of the second data. The processing logic causes the TLC word line and the bit lines to be discharged to perform a recovery operation.

Figure 14:
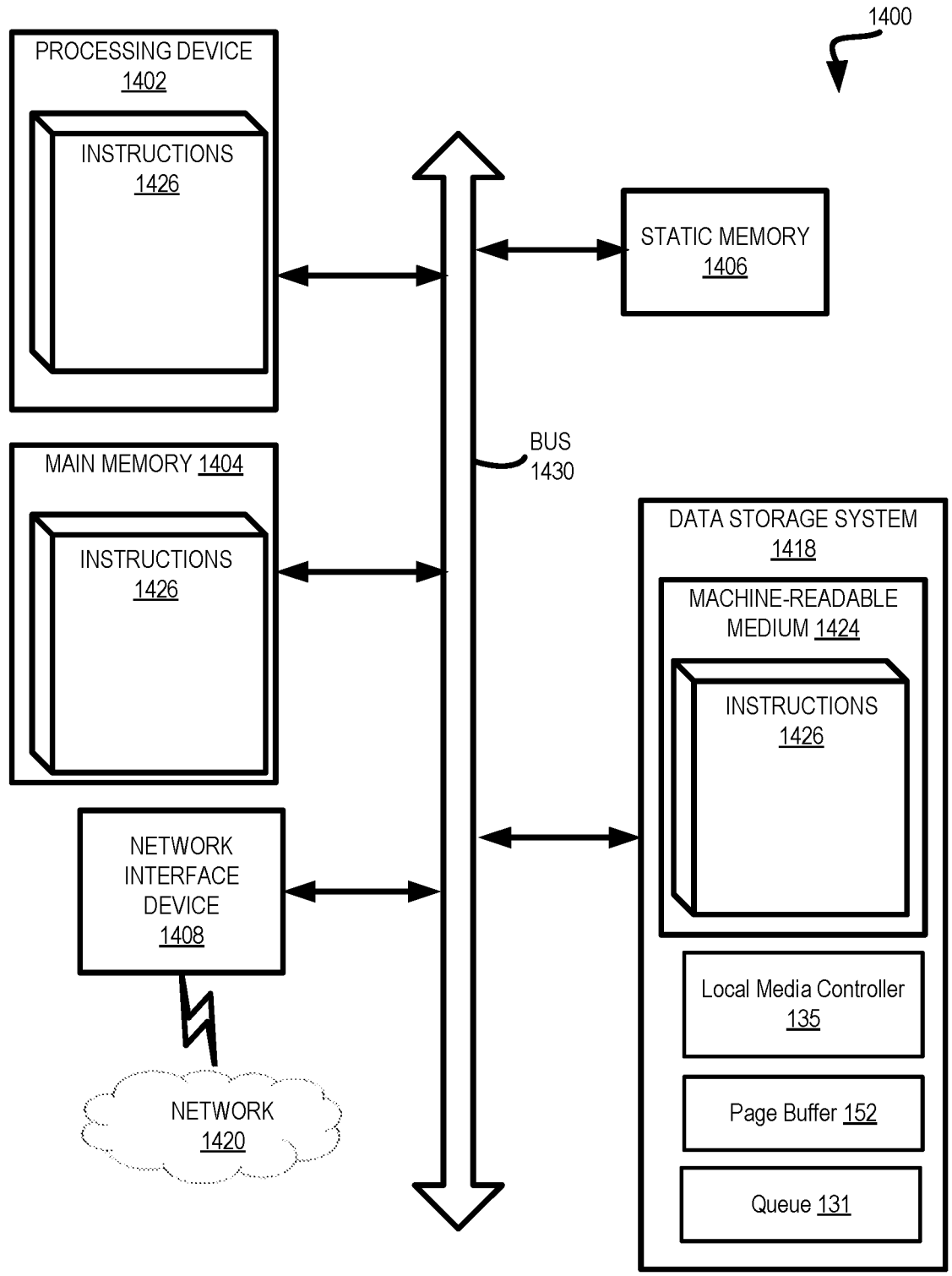
FIG. 14 is a block diagram of an example computer system in which embodiments of the present disclosure can operate.

FIG. 14 illustrates an example machine of a computer system 1400 within which a set of instructions, for causing the machine to perform any one or more of the methodologies discussed herein, can be executed. In some embodiments, the computer system 1400 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM) or Rambus DRAM (RDRAM), etc.), a static memory 1410 (e.g., flash memory, static random access memory (SRAM), etc.), and a data storage system 1418, which communicate with each other via a bus 1430.

Processing device 1402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 can also be one or more special-purpose processing devices such as an application specific integrated circuit (ASIC), a field programmable gate array (FPGA), a digital signal processor (DSP), network processor, or the like. The processing device 1402 is configured to execute instructions 1428 for performing the operations and steps discussed herein. The computer system 1400 can further include a network interface device 1412 to communicate over the network 1420.

The data storage system 1418 can include a machine-readable storage medium 1424 (also known as a computer-readable medium) on which is stored one or more sets of instructions 1428 or software embodying any one or more of the methodologies or functions described herein. The data storage system 1418 can further include the local media controller 135, the page buffer 152 or 352, and the queue 131 that were previously discussed. The instructions 1428 can also reside, completely or at least partially, within the main memory 1404 and/or within the processing device 1402 during execution thereof by the computer system 1400, the main memory 1404 and the processing device 1402 also constituting machine-readable storage media. The machine-readable storage medium 1424, data storage system 1418, and/or main memory 1404 can correspond to the memory sub-system 110 of FIG. 1A.

In one embodiment, the instructions 1426 include instructions to implement functionality corresponding to a controller (e.g., the memory sub-system controller 115 of FIG. 1A). While the machine-readable storage medium 1424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device comprising:
   an array of memory cells comprising a first word line coupled to at least a subset of the array of memory cells; and
   control logic coupled to the first word line, the control logic to perform operations comprising:
      detecting, within a queue, a first read command to read first data from a first page of the subset of the array and a second read command to read second data from a second page of the subset of the array;
      causing a voltage applied to the first word line to move to a target value;
      causing a page buffer to sense the first data from a first bit line coupled to the first page and to sense the second data from a second bit line coupled to the second page; and
      causing the first word line to be discharged.

2. The device of claim 1, further comprising the queue coupled with the control logic, wherein the second read command is stored consecutive to the first read command in the queue, and wherein causing the page buffer to sense the first data and the second data further comprises causing the page buffer to pre-charge the first bit line and the second bit line.

3. The device of claim 1, further comprising causing the voltage applied to the first word line to ramp up to an initial value, which together with causing the voltage applied to the first word line to move to the target value, and causing the first word line to be discharged are caused to be performed by the control logic only once.

4. The device of claim 1, wherein the operations further comprise:
   receiving a first cache release command associated with at least a first latch of the page buffer; and
   causing the first data to be stored in the first latch of the page buffer.

5. The device of claim 4, wherein the operations further comprise:
   receiving a second cache release command associated with at least a second latch of the page buffer; and
   causing the second data to be stored in the second latch of the page buffer.

6. The device of claim 1, wherein the subset of the array is configured as a single-level-cell (SLC) memory.

7. The device of claim 1, wherein the first read command is to perform a first read operation of one of a lower page or an upper page of multiple cells configured as one of multi-level-cell (MLC) memory, triple-level cell (TLC) memory, quad-level cell (QLC) memory, or penta-level cell (PLC) memory, and wherein the second read command is to perform a second read operation of the one of the lower page of the upper page.

8. The device of claim 1, wherein the first read command is to perform a first read operation of an extra page of multiple cells configured as one of triple-level cell (TLC) memory, quad-level cell (QLC) memory, or penta-level cell (PLC) memory, and wherein the second read command is to perform a second read operation of the extra page.

9. A device comprising:
an array of memory cells comprising a first word line coupled to at least a subset of the array of memory cells; and
control logic coupled to the first word line, the control logic to perform operations comprising:
accessing a set of first read commands to read first data from a first lower page of a first subset of an array of memory cells, the array of memory cells being configured as one of multi-level-cell (MLC) memory, triple-level cell (TLC) memory, quad-level cell (QLC) memory, or penta-level cell (PLC) memory, wherein the first subset of the array is coupled to a word line of the array;
causing a voltage applied to the word line to move to a target value;
causing a page buffer to sense a first portion of the first data from a first bit line coupled to the first lower page and to sense a second portion of the first data from a second bit line coupled to the first lower page of the first subset of the array; and
causing the voltage applied to the word line to again move to the target value.

10. The device of claim 9, further comprising a queue coupled with the control logic, the queue to store the first set of read commands and a second set of read commands that are consecutive to the first set of read commands in the queue, and wherein causing the page buffer to sense the first portion of the first data and the second portion of the first data further comprises causing the page buffer to pre-charge the first bit line and the second bit line.

11. The device of claim 9, wherein the operations further comprise:
receiving a first cache release command associated with a first latch of the page buffer;
causing the first portion of the first data to be stored in the first latch;
receiving a second cache release command associated with a second latch of the page buffer; and
causing the second portion of the first data to be stored in the second latch.

12. The device of claim 9, wherein the operations further comprise:
accessing a set of second read commands to read second data from a second lower page of a second subset of the array of memory cells;
causing the page buffer to pre-charge a third bit line coupled to the second lower page of the second subset of the array and to sense a first portion of the second data;
causing the page buffer to pre-charge a fourth bit line coupled to the second lower page of the second subset of the array and to sense a second portion of the second data; and
causing the word line to be discharged.

13. The device of claim 12, where the operations further comprises:
receiving a third cache release command associated with a latch of the page buffer;
causing the first portion of the second data to be stored in the latch;

receiving a fourth cache release command associated with the latch of the page buffer; and
causing the second portion of the second data to be stored in the latch.

14. A device comprising:
an array of memory cells comprising a first word line coupled to at least a subset of the array of memory cells;
a page buffer comprising a plurality of latches to cache data read out of the array; and
control logic coupled to the first word line and the page buffer, the control logic to, in response to receiving a first read command from a processing device, perform operations comprising:
causing a voltage applied to the first word line to move to a target value;
causing the page buffer to sense first data from a first bit line coupled to a first page of the subset of the array;
receiving, from the processing device, a first cache release command associated with at least a first latch of the plurality of latches; and
causing, in response to the first cache release command and during a recovery period of the first word line, the first data to be stored in the first latch.

15. The device of claim 14, wherein the receiving the first cache release command is in response to a select gate of the array being clocked out.

16. The device of claim 14, wherein the operations further comprise:
managing storing the first data in the first latch of the page buffer based on latch availability among the plurality of latches; and
transferring the first data to the processing device in response to receiving a second cache release command.

17. The device of claim 16, wherein neither of the first cache release command nor the second cache release command is a subsequent cache command received from the processing device.

18. The device of claim 14, wherein the first read command is stored within a queue consecutive to a second read command, and wherein the operations further comprise:
receiving the second read command to read second data from a second page of the subset of the array;
after a voltage applied to the first word line is moved to the target value, causing the page buffer to sense the second data from a second bit line coupled to the second page;
receiving a second cache release command associated with at least a second latch of the plurality of latches before receiving the first cache release command; and
causing, in response to the second cache release command and before the recovery period of the first word line, the second data to be stored in the second latch of the page buffer.

19. The device of claim 18, wherein the operations further comprise receiving the second cache release command in response to a select gate of the array being clocked out.

20. The device of claim 18, wherein the operations further comprise:
managing storing the first data in the first latch and the second data in the second latch of the page buffer based on latch availability among the plurality of latches; and
transferring the first data and the second data to the processing device in response to receiving a third cache release command.

* * * * *